United States Patent
Le et al.

(10) Patent No.: US 7,880,536 B2
(45) Date of Patent: Feb. 1, 2011

(54) SIMPLIFIED SALLEN-KEY LOW-PASS FILTER CIRCUIT

(75) Inventors: Nguyen-Trieu-Luan Le, Cornelles-le-Royal (FR); David Le Deaut, Nuremberg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/630,848

(22) PCT Filed: Jun. 20, 2005

(86) PCT No.: PCT/IB2005/052021
§ 371 (c)(1),
(2), (4) Date: Dec. 7, 2007

(87) PCT Pub. No.: WO2006/000984
PCT Pub. Date: Jan. 5, 2006

(65) Prior Publication Data
US 2008/0204129 A1     Aug. 28, 2008

(30) Foreign Application Priority Data
Jun. 23, 2004   (EP)   ................... 04300393

(51) Int. Cl.
*H03K 5/00*    (2006.01)
(52) U.S. Cl. ...................... 327/558; 327/552
(58) Field of Classification Search .......... 327/551–559
See application file for complete search history.

(56) References Cited

U.S. PATENT DOCUMENTS

| | | | | |
|---|---|---|---|---|
| 4,524,332 | A * | 6/1985 | Gay | 330/294 |
| 5,293,087 | A * | 3/1994 | Hamano et al. | 327/558 |
| 6,308,055 | B1 * | 10/2001 | Welland et al. | 455/260 |
| 6,344,773 | B1 | 2/2002 | Sevastopoulos et al. | |
| 6,388,511 | B1 * | 5/2002 | Kanao | 327/558 |
| 6,407,627 | B1 * | 6/2002 | Martin | 327/552 |
| 6,618,579 | B1 * | 9/2003 | Smith et al. | 455/307 |
| 7,343,538 | B2 * | 3/2008 | Ricca et al. | 714/740 |
| 7,375,583 | B2 * | 5/2008 | Ohannaidh | 327/558 |

OTHER PUBLICATIONS

Yuanying Deng et al: "Design of a IV 250MHZ Current-Mode Filter in Conventional CMOS Process"; ISCAS 2001 Proceedings IEEE Sydney Australia May 6-9, 2001; vol. 1 of 5 pp. 236-239.
Schmid H et al: "Fundamental Frequency Limitations in Current-Mode Sallen-Key Filters" Circuits and Systems 1998 IEEE New York; US; vol. 1 May 31, 1998 pp. 57-60.

\* cited by examiner

*Primary Examiner*—Hai L Nguyen

(57) ABSTRACT

Circuits, methods and devices for providing low-pass filtering are implemented according to a number of different embodiments. In one such embodiment a Sallen-Key low-pass filter circuit is implemented that comprises a first resistor and a second resistor connected in series, the first resistor being connected between the second resistor and an input of the circuit. The second resistor is directly connected between the first resistor and an output of the circuit.

20 Claims, 1 Drawing Sheet

SIMPLIFIED SALLEN-KEY LOW-PASS FILTER CIRCUIT

FIELD OF THE INVENTION

The present invention relates to a simplified Sallen-Key low-pass filter circuit.

BACKGROUND OF THE INVENTION

The known Sallen-Key low-pass filter circuit comprises:
a first and a second resistor connected in series, the first resistor being connected on one end to an input of the circuit,
an amplifier of unity gain connected between the second resistor and an output of the circuit, and
a feedback path connecting the output of the amplifier to a junction between the first and the second resistor.

Examples of such circuits are described in: Jeffrey A. Weldon, R. Sekhar Narayanaswami, Jacques C. Rudell, Li Lin, Matsanori Otsuka, Sébastien Dedieu and Paul Grey, "A 1.75-GHz highly integrated narrow-band CMOS transmitter with harmonic-rejection mixer", *IEEE Journal of solid-state circuits*, vol. 36, no 12, December 2001 (hereinafter referenced to as "D1").

It is desirable to reduce the power consumption of the Sallen-Key low-pass filter circuit.

SUMMARY OF THE INVENTION

Accordingly, it is an object of the invention to provide a Sallen-Key low-pass filter circuit having reduced power consumption.

The invention provides a Sallen-Key low-pass filter circuit wherein the second resistor is directly connected between the first resistor and an output of the circuit.

In this circuit, the amplifier of unity gain is replaced by a wire. Thus, the power consumption of the circuit is reduced.

The features of claim 2 improve the filter attenuation at high frequencies.

The features as defined in claim 3 have the advantages to improve the stability of the filter circuit.

Other features of the Sallen-Key low-pass filter circuit are recited in the dependent claims.

The invention also relates to a mobile phone including a Sallen-Key low-pass filter circuit according to claims 1 through 4.

These and other aspects of the Sallen-Key low-pass filter circuit will be apparent from the following description, drawings and from the claims.

DESCRIPTION OF THE PREFERRED EMBODIMENTS

Figure 1:
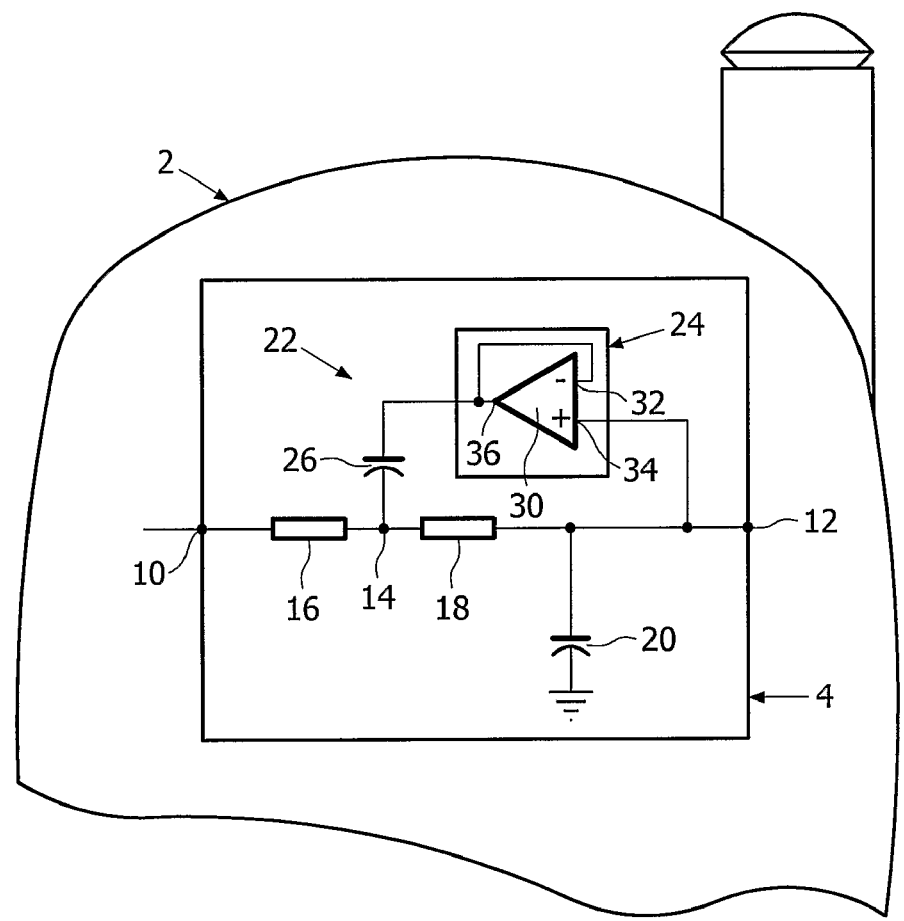
FIG. 1 is a schematic diagram of a mobile phone incorporating a Sallen-Key low-pass filter circuit according to the invention.

FIG. 1 represents a part of a mobile phone 2 having a Sallen-Key low-pass filter circuit 4. For example, circuit 4 is used to filter an I or Q baseband signal generated by a digital-to-analog converter of phone 2.

Circuit 4 has an input 10 to receive the signal to be filtered and an output 12 to deliver the filtered signal.

The input 10 is connected to a junction 14 through a first resistor 16.

A second resistor 18 is directly connected between junction 14 and output 12.

A capacitor 20 is connected on one side to ground and on the other side to a junction between resistor 18 and output 12.

Circuit 4 also comprises a feedback path 22 connecting output 12 to junction 14. Feedback path 22 comprises an amplifier 24 of unity gain connected in series with a capacitor 26.

For example, amplifier 24 comprises an operational amplifier 30 having a negative input terminal 32 and a positive input terminal 34 and an output terminal 36. Output terminal 36 is connected to negative input terminal 32 and to an electrode of capacitor 26. Input terminal 34 is directly connected to output 12.

Another electrode of capacitor 26 is directly connected to junction 14.

The transfer function of circuit 4 is the following:

$$\frac{Vout}{Vin} = \frac{\frac{1}{R1R2C1C2}}{s^2 + s\left(\frac{R1+R2}{R1R2C1}\right) + \frac{1}{R1R2C1C2}}$$

where:
$V_{out}$ is the voltage at output 12,
$V_{in}$ is the voltage at input 10,
R1 and R2 indicate the resistor values of resistors 16 and 18, respectively,
C1 and C2 indicate the capacitance values of capacitors 26 and 20, respectively,
s is the Laplace variable equal to jω, where j equals $\sqrt{-1}$ and ω is the frequency in radians.

This transfer function is a Sallen-Key transfer function.

In comparison with the Sallen-Key low-pass filter circuit disclosed in D1, which has two amplifiers, circuit 4 has a reduced power consumption since it only uses one amplifier to achieve the same performance. Circuit 4 is also smaller than the filter circuit disclosed in D1.

Figure 2:
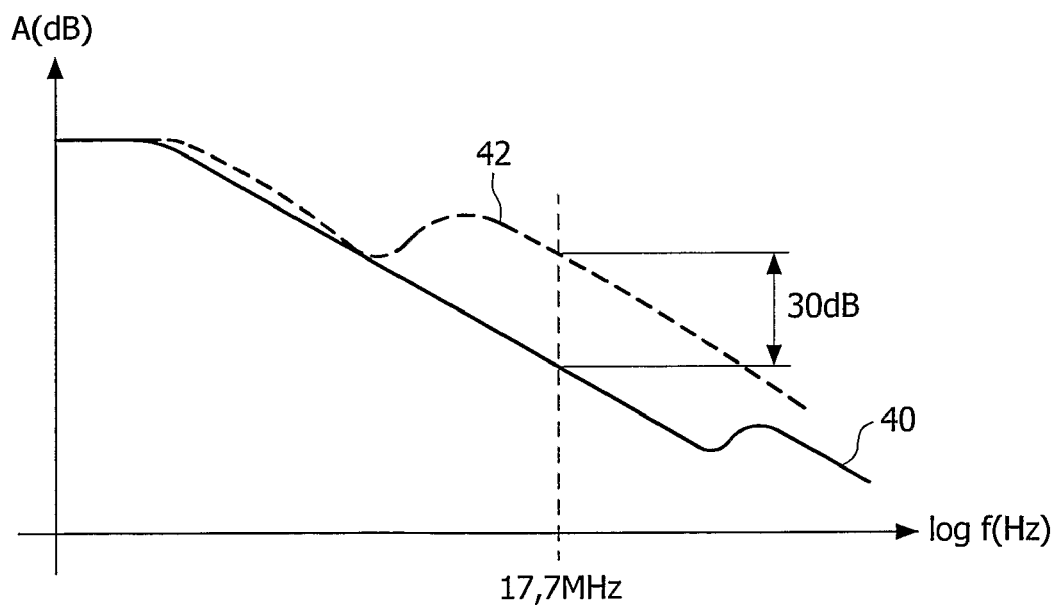
FIG. 2 is a graph on a graphical representation of a transfer function of the circuit of FIG. 1.

FIG. 2 illustrates on the same graphic a transfer function 40 of circuit 4 and a transfer function 42 of another conventional Sallen-Key low-pass filter circuit.

The vertical and horizontal axis of the graph represents the attenuation in decibels and corresponding frequency, respectively.

The other conventional Sallen-Key low-pass filter circuit comprises only one amplifier connected between resistor 18 and output 12 and the feedback path only includes capacitor 20. In comparison with the conventional Sallen-Key low-pass filter, circuit 4 provides better attenuation performance at high frequencies.

Many additional embodiments are possible. For example, amplifier 34 can be replaced by an amplifier of gain K where K is not equal to 1.

Furthermore, differential filter circuit having two inputs and two outputs can be built using two circuits 4 connected to one another through capacitor 20. In such an embodiment, the capacitance of capacitor 20 is equal to half the capacitance value of capacitor 20 in circuit 4.

The invention claimed is:

1. A Sallen-Key low-pass filter circuit that includes an amplifier configured as part of the modified Sallen-Key low-pass filter circuit to provide a Sallen-Key low-pass filtered signal, the Sallen-Key low-pass filter circuit comprising:
   an output configured to provide the Sallen-Key low-pass filtered signal to an external circuit;
   a first resistor; and
   a second resistor connected in series with the first resistor, wherein the first resistor is connected between the second resistor and an input of the Sallen-Key low-pass filter circuit, wherein the second resistor is directly connected between the first resistor and the output of the Sallen-Key low-pass filter circuit and arranged for providing the Sallen-Key low-pass filtered signal via a direct current path to the output.

2. The circuit of claim 1, wherein the Sallen-Key low-pass filter is configured to provide a Sallen-Key transfer function, wherein the circuit comprises a feedback path from the output of the circuit to a junction between the two resistors, and the feedback path is arranged for providing a direct current path from the output to the amplifier that is part of the feedback path.

3. The circuit of claim 2, wherein the gain of the amplifier is equal to 1.

4. The circuit of claim 2, wherein the feedback path also comprises a first capacitor connected between the junction and an output of the amplifier.

5. The circuit according to claim 1, wherein the circuit also comprises a second capacitor having a first terminal directly connected to the output of the circuit.

6. The circuit of claim 1, wherein
   a feed forward path including the first and second resistors and provided between the input and the output; and
   a feedback path, including the amplifier and a capacitor connected to a circuit node between the first and second resistors, and provided between the output and the input.

7. The circuit of claim 1, wherein
   a feed-forward path including the first and second resistors and provided between the input and the output; and
   a feedback path, including the amplifier and a capacitor connected to a circuit node between the first and second resistors, and provided between the output and the input, the capacitor being configured and arranged to electrically separate an output of the amplifier from circuits that are external to the feedback path.

8. The circuit of claim 1, further including a capacitor connected to a circuit node between the first and second resistors and configured and arranged to electrically isolate an output of the amplifier from circuits external to the low-pass filter circuit.

9. The circuit of claim 1, wherein there is no resistive, capacitive or inductive element, other than that of a wire, between the second resistor and the output.

10. The circuit of claim 1, wherein there is no current-isolation amplifier between the second resistor and the output.

11. The circuit of claim 1, wherein there is no active element between the second resistor and the output.

12. A mobile phone, comprising:
    a current-sinking load;
    a Sallen-Key lowpass filter circuit for receiving a signal and providing a Sallen-Key lowpass filtered signal to an external circuit, the circuit including
    an output connected to the current-sinking load;
    a feedback path;
    a first resistor and a second resistor connected in series, wherein the first resistor is connected between the second resistor and an input of the circuit, wherein the second resistor is directly connected between the first resistor and an output of the circuit for providing the Sallen-Key low-pass filtered signal with a Sallen-Key transfer function via a direct current path to the output and wherein the output of the circuit is directly connected to the feedback path for providing a direct current path to the feedback path.

13. The mobile phone of claim 12, wherein there is no current-isolation amplifier between the second resistor and the output.

14. The mobile phone of claim 12, wherein there is no active element between the second resistor and the output.

15. The mobile phone of claim 12, wherein there is no resistive, capacitive or inductive element, other than that of a wire, between the second resistor and the output.

16. The mobile phone of claim 12, further including a feedback loop including an amplifier having an amplified output and a capacitor connected to a circuit node between the first and second resistors and configured to separate the amplified output from circuits external to the feedback loop.

17. A mobile phone using baseband signals to provide wireless communications, the mobile phone comprising:
    an antenna for communicating the wireless communications;
    a Sallen-Key filter circuit having an output and having an input for receiving the baseband signals and providing a Sallen-Key low-pass filtered signal with a Sallen-Key transfer function at the output by providing a filtered form of the baseband signals to a load circuit of the mobile phone, having a feedback loop connected to the output, having a first resistor connected to receive the baseband signals from the input, and having a second resistor connected in series with the first resistor, the first resistor and second resistor being connected and arranged for passing the baseband signals, via a direct current path, from the input and providing the Sallen-Key low-pass filtered signal with a non-unity-gain transfer function to the output.

18. The mobile phone of claim 17, wherein the Sallen-Key filter circuit is a Sallen-Key low-pass filter circuit having an amplifier that provides an amplified output to the feedback loop, the amplified output being separated from the Sallen-Key filter circuit output by a capacitor that isolates the amplified output from external circuits to mitigate power draw from the amplifier.

19. The mobile phone of claim 17, wherein the output is configured and arranged to drive the load circuit.

20. The mobile phone of claim 17, wherein the feedback loop including an amplifier having an amplified output and a capacitor connected to a circuit node between the first and second resistors and configured to separate the amplified output from circuits external to the feedback loop.

* * * * *